US009520636B2

(12) United States Patent
Ferrand et al.

(10) Patent No.: US 9,520,636 B2
(45) Date of Patent: Dec. 13, 2016

(54) LINEAR RESONATOR OF A HIGH-FREQUENCY ANTENNA FOR A NUCLEAR MAGNETIC RESONANCE IMAGING APPARATUS (75) Inventors: Guillaume Ferrand, Paris (FR); Michel Luong, Sceaux (FR); Alain France, Bordeaux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1162 days.

(21) Appl. No.: 13/577,557

(22) PCT Filed: Feb. 7, 2011

(86) PCT No.: PCT/FR2011/050241
§ 371 (c)(1),
(2), (4) Date: Sep. 13, 2012

(87) PCT Pub. No.: WO2011/098713
PCT Pub. Date: Aug. 18, 2011

(65) Prior Publication Data
US 2013/0015858 A1    Jan. 17, 2013

(30) Foreign Application Priority Data
Feb. 9, 2010   (FR) ..................... 10 50905

(51) Int. Cl.
*H01P 5/10*         (2006.01)
*G01R 33/34*        (2006.01)
(Continued)

(52) U.S. Cl.
CPC ............. *H01P 5/10* (2013.01); *G01R 33/3415* (2013.01); *G01R 33/3456* (2013.01);
(Continued)

(58) Field of Classification Search
CPC .......... H01P 5/10; H01P 1/203; H01P 1/20345
(Continued)

(56) References Cited

U.S. PATENT DOCUMENTS 4,746,866 A    5/1988   Roschmann
4,751,464 A    6/1988   Bridges
(Continued)

OTHER PUBLICATIONS

International Search Report as issued for PCT/FR2011/050241, dated Apr. 21, 2011.
(Continued)

*Primary Examiner* — Dean Takaoka
*Assistant Examiner* — Alan Wong
(74) *Attorney, Agent, or Firm* — Pillsbury Winthrop Shaw Pittman LLP (57) ABSTRACT

A linear resonator of a high-frequency antenna suitable for emitting a radiofrequency energisation signal and for receiving a radiofrequency relaxation signal, the linear resonator includes a radiating element to emit af radiofrequency energisation signal and receive a radiofrequency relaxation signal. The resonator also includes: a balun circuit including a power-supply line and two coupling lines; a substrate made of a dielectric material, supporting the radiating element which contains the balun circuit; two contact points connecting the balun circuit to the radiating element, the contact points being formed by one of the ends of the coupling lines extending out of the substrate, the distance separating the two contact points being selected so as to ensure the impedance matching of the resonator; and a chip floorplan separating the coupling lines from the radiating element.

20 Claims, 5 Drawing Sheets (51) Int. Cl.
  *G01R 33/3415* (2006.01)
  *G01R 33/345* (2006.01)
  *G01R 33/28* (2006.01)
  *H01P 1/203* (2006.01)
  *G01R 33/36* (2006.01)
  *G01R 33/422* (2006.01)

(52) U.S. Cl.
  CPC ..... *G01R 33/34076* (2013.01); *G01R 33/365* (2013.01); *G01R 33/3685* (2013.01); *G01R 33/3628* (2013.01); *G01R 33/422* (2013.01)

(58) Field of Classification Search
  USPC ..... 333/25, 26, 33, 156, 202, 204, 236, 238, 333/4, 5; 343/837, 850, 853, 859
  See application file for complete search history.

(56) References Cited

U.S. PATENT DOCUMENTS

| | | | | |
|---|---|---|---|---|
| 4,800,393 | A * | 1/1989 | Edward | H01Q 9/065 333/26 |
| 5,557,247 | A | 9/1996 | Vaughn, Jr. | |
| 6,882,318 | B2 * | 4/2005 | Nevermann | H01Q 1/243 343/700 MS |
| 7,084,829 | B2 * | 8/2006 | Shirosaka | H01Q 1/38 342/361 |
| 7,724,200 | B2 * | 5/2010 | Kitamori | H01Q 9/285 343/795 |
| 8,599,083 | B2 * | 12/2013 | Lindenmeier | H01Q 7/00 343/741 |
| 2005/0062472 | A1 | 3/2005 | Bottomley | |

OTHER PUBLICATIONS

Adriany G et al.; "A Geometrically adjustable 16 Channel Transceive Transmission Line Array for 7 Tesla" International Society for magnetic Resonance in Medicine. Scientific Meeting and Exhibition. Proceedings, International Society for Magnetic Resonance in Medicine, US, vol. 13, Jan. 1, 2005, p. 673, XP 002472561.
Tian J. et al.; "Frequency Limits and Radiation Resistance for Volume Coils", International Society for Magnetic Resonance in Medicine. Scientific Meeting and Exhibition. Proceedings, International Society for Magnetic Resonance in Medicine, US, Vo. 11, Jul. 10, 2003, p. 2354, XP007914507.
Setsompop K. et al.; "Parallel RF Transmission with Eight Channels at 3 Tesla", Magnetic Resonance in Medicine, Academic Press, Duluth, MN, US LNKD-DOI:10.1002/MRM.21042, vol. 56. No. 5, Nov. 1, 2006, pp. 1163-1171, XP002513112.
Adriany Gregor et al.; "Transmit and Receive Transmission Line Arrays for 7 Tesla Parallel Imaging", Magnetic Resonance in Medicine, Academic Press, Duluth, MN, US LNKD-DOI:10.1002/MRM.20321, vol. 53, No. 2, Feb. 1, 2005, pp. 434-445, XP002495549.
Yamykh V L; "Actual Flip-Angle Imaging in the Pulsed Steady State: A Method for Rapid Three-Dimensional Mapping of the Transmitted Radiofrequency Field", Magnetic Resonance in Medicine, Academic Press, Duluth, MN, US LNKD-DOI:10.1002/MRM.21120, vol. 57, Jan. 1, 2007, pp. 192-200, XP002530750.
Setsompop K. et al., "Slice-Selective RF Pulses for In Vivo $B_1^+$ Inhomogeneity Mitigation at 7 Tesla Using Parallel RF Excitation With a 16-Element Coil", Magnetic Resonance in Medicine 60; pp. 1422-1432 (2008); XP007915199.
Pauly et al.; "A K-Space Analysis of Small-Tip-Angle Excitation", Information Systems Laboratory, Stanford University, Stanford California 94305, Journal of Magnetic Resonance 81, pp. 43-56, 1989.

* cited by examiner

LINEAR RESONATOR OF A HIGH-FREQUENCY ANTENNA FOR A NUCLEAR MAGNETIC RESONANCE IMAGING APPARATUS

CROSS REFERENCE TO RELATED APPLICATIONS

This application is the U.S. National Stage of PCT/FR2011/050241, filed Feb. 7, 2011, which in turn claims priority to French Patent Application No. 1050905, filed Feb. 9, 2010, the entire contents of all applications are incorporated herein by reference in their entireties.

The present invention relates to a linear resonator of a high-frequency antenna with multiple receiving and/or transmission channels, particularly used in Nuclear Magnetic Resonance (NMR) apparatuses and applications thereof: Magnetic Resonance Imaging (MRI) for human or animal subjects, Magnetic Resonance Spectroscopy (MRS) and even diffusion tensor imaging (DTI).

The field of the invention is that of Nuclear Magnetic Resonance (NMR), including the applications cited in the preceding.

The invention particularly concerns high-frequency antennas having multiple receiving and transmitting channels that are used to examine an entire human body or just a part of the body, such as the head, in NMR apparatuses and more particularly in Magnetic Resonance Imaging (MRI) apparatuses with a very strong magnetic field, that is to say higher than 7 Tesla. The purpose of these apparatuses is to excite the magnetic spins of the hydrogen atoms in the specimen placed inside the antenna and to collect the radio-frequency signal they emit during the relaxation that will be explained in the following.

The antennas of MRI apparatuses are made in known manner from copper radiating elements in various forms that serve either as emitting antennas, in resonance with the circuit by which they are supplied, or a receivers of relaxation signals, or more generally alternating between these two roles. They surround the patient or just the body part that is to be analysed.

When placed within the permanent longitudinal magnetic field $B_0$ of an NMRT apparatus, they receive electrical excitation that enables them to produce magnetic field $B_1$ orthogonal to $B_0$, and/or they receive the radiofrequency (RF) signal corresponding to the precession or relaxation resonance frequency (also called the Larmor frequency) of the atom nuclei under examination that are located within magnetic field $B_0$ and have briefly been exposed to magnetic field $B_1$.

It will be recalled that under the influence of static magnetic field $B_0$ the spin magnetic moments of the hydrogen atom nuclei will align themselves progressively in a direction that is initially parallel to magnetic field $B_0$, thus causing global magnetisation in the direction of field $B_0$, this being longitudinal direction z.

When excitation is applied in the form of a pulse, that is to say a radiofrequency field that oscillates at the Larmor frequency with a magnetic component designated $B_1$ and perpendicular to $B_0$, the spin magnetic moments will then resonate and deviate progressively from this longitudinal axis z, eventually reaching a flip angle, designated FA, relative to this initial axis and describing a movement that is called precession movement. Radiofrequency field $B_1$ thus enables the spin magnetic moments to be "flipped" through an angle FA relative to the direction of field $B_0$.

When the excitation is interrupted, the spin magnetic moments that have deviated from their initial axis return to their initial position of equilibrium, that is to say axis z, while still spinning. This return to equilibrium is called relaxation. At this point, it becomes possible to measure this rotational movement of the spins in the form of a very weak radiofrequency field received by the antenna, the received radiofrequency field being at the same frequency as the exciter radiofrequency field, that is to say the Larmor resonance frequency.

The antennas according to the invention are designed to radiate pulse magnetic field $B_1$, or to receive the signals generated by the relaxation of the nuclei of the hydrogen atoms, and preferably to carry out both of these functions at successive times.

In particular, the antennas used to examine a body part, and particularly the head, are antennas that operate with a close magnetic field, that is to say close to the radiating physical elements.

Consequently, in this type of antenna, when introduced into the antenna, the "load", that is to say the head or another body part of the patient, has a response effect in the close radiofrequency field of the antenna. Thus, introducing a load into an MRI antenna significantly changes the tuning and matching frequencies of the antenna as determined beforehand.

Moreover, from a radioelectric point of view, a human head presents an extremely irregular impedance, which generates a large number of artefacts.

The intensities of magnetic field $B_0$ used in medical imaging are usually in the range from 0.1 to 3 Tesla. At these low magnetic field intensities, the operating frequency, corresponding to the Larmor frequency, is also low. By way of example, for a magnetic field $B_0$ of 1.5 Tesla, the corresponding Larmor frequency is 64 MHz, and for a magnetic field $B_0$ of 3 Tesla, the corresponding Larmor frequency is 128 MHz.

Up to a frequency of 128 MHz, the antennas used are resonant cavity structures. This antenna type is known by various names, including "birdcage" or "Traverse Electric and Magnetic" (TEM) and includes:
  a series of transmission lines coupled with each other for create a resonance mode;
  a shield that surrounds this series of transmission lines, and
  two or four connection ports ("RF ports") which are interposed between the transmission lines and the shield and are designed for radiofrequency excitation of the resonant cavity and to detect NMR radiofrequency signals.

This type of antenna is described in particular in the following documents:
  [1] U.S. Pat. No. 4,746,866 (Röschmann)
  [2] U.S. Pat. No. 4,751,464 (Bridges)
  [3] U.S. Pat. No. 5,557,247 (Vaughn, Jr.)
  [4] Proc. Int. Soc. Mag. Res. Med. 11, 2003, No. 2354 (Vaughn).

These documents essentially deal with improvements made to the transmission lines of a resonant cavity and particularly described the means for tuning each transmission line to the desired working frequency, which are generally represented by mechanical means for adjusting the electromagnetic coupling between the transmission lines and the shield.

Thus, document [1] discloses an antenna that is designed for use with an MRI apparatus and includes transmission lines that are similar to coaxial cables. Each transmission line comprises an external cylinder, which is hollow and electrically conductive, made from a dielectric material, inside of which are located two central conductors, of which at least one is axially displaceable.

An external shield is coupled with the central conductors via the ends of the external cylinder, particularly by means of sliding contacts.

Document [2] describes a resonant cavity in which the transmission lines are formed by segments of conductive strips with sections of a dielectric material interposed between them. An external shield is coupled to the transmission lines via capacitors located at the end of each transmission line. The resonant cavity is tuned by means of adjustable slits formed in the external shield. In document [2], the "bars" have the form of thin strips with rectangular cross section. On the other hand, the primary surface of the dielectric elements is parallel to the axis of the bar. The bars (or strips) are fixed elements that do not allow of any adjustment. Finally, the connection between the bar and the envelope is insulating.

Document [3] uses transmission lines that are similar to coaxial cables, such as those described in document [1], to create a birdcage type resonant cavity. This document also described a mechanical system for tuning multiple transmission lines simultaneously.

The known resonant cavities, described in the cited documents, all share the same disadvantage in that they do not function satisfactorily when they are used with high magnetic field values, that is to say above 7 Tesla and/or above a high frequency in the order of 298 MHz, in order to increase the signal-to-noise ratio. In fact, up to 3 Tesla the corresponding Larmor frequency is low and the artefacts are tolerable, so that it is possible to obtain a good quality image of the zone under examination.

For example, experiments and a digital simulation of the resonator described in document [4] by the finite elements method show that such a resonator is limited to resonance frequencies of the proton (Larmor frequency) that are lower than about 400 MHz, or to magnetic fields less than 4 Tesla for cylindrical volumes of 27 cm diameter and 25 cm length, such volumes corresponding to usable volumes capable of accommodating a human head.

In fact, in order to increase the frequency, the central conductors of the transmission lines must be withdrawn completely, which results in losses due to radiation and unsatisfactory homogeneity of the field B1 produced.

Accordingly, when the Larmor frequencies are higher than 128 MHz, the antennas of volumetric type and operating in quadrature mode, as described in the preceding, begin to show their limitations in terms of the homogeneous excitation of the protons.

In fact, magnetic field $B_1$ is susceptible to disturbances as soon as the subject's head is introduced. Substantial artefacts are created, rendering these antennas practically unusable with elevated magnetic field values, that is to say above 7 Tesla. At the same time, particularly in the field of medical imaging it is advantageous to be able to obtain a good quality image that accurately reflects the nature of the tissues of the subject under examination. It is therefore necessary to have a high frequency antenna that is capable of providing homogeneous separation of the excitement of protons that is not adversely affected by the introduction of a "load" inside the antenna when high magnetic field conditions prevail.

For these frequencies higher than 128 MHz, array type antennas have been developed, formed by a distribution of a plurality of resonators, generally between 8 and 32, which function as transmitters and receivers and which are arranged around the specimen to be measured.

Each resonator comprises a dedicated control path or channel for transmitting and receiving the radiofrequency signal. Each resonator thus enables the production of an image of the anatomical region corresponding to its position. The various images are then combined using algorithms to create the final image.

There are two families of array type antennas:
antennas comprising linear resonators made from rectilinear copper sheets integrated in an insulating body according to the "microstrip" method, generally referred to by the misnomer "stripline antennas", and
antennas comprising loop resonators, often made from a copper sheet bonded to an insulating element, which is often flexible, and applied directly to the specimen that is to be analysed.

In order to be able to use this type of array antenna efficiently, it is necessary to control each resonator individually via its own channel with appropriate amplitude and phase using a power amplifier. This makes it possible to monitor the spatial excitation of the protons in MRI surrounding the specimen to be measured.

This known technique, called parallel transmission, particularly makes it possible to homogenise excitation in a selected "region of interest" (ROI).

The following two documents describe the two families of array antennas and the parallel transmission technique respectively:

[5] Magnetic Resonance in Medicine 53:434445, 2005 (Adriany), [6] Magnetic Resonance in Medicine 56:11631171, 2006 (Setsompop).

The linear resonators described in document [5] are created by sticking adhesive strips or sheets of copper to a body made from Teflon (polytetrafluoroethylene). The copper strip carrying the current that generates the radiated electromagnetic field is 12 mm wide and 160 mm long. The copper strip is supplied via one of the two ends thereof via a frequency tuning and matching circuit and has some characteristics of a quarter-wave resonator; the radiated electromagnetic field varies considerably from one end to the other. Moreover, the tuning and matching circuit is made up of localized capacitors and inductors with finite dimensions, with a low quality factor, and is unavoidably the source of loss and of significant interaction with the radiating strip.

Finally, the simplicity of this arrangement does not allow the installation of a passive insulating means (shielding) to reduce mutual coupling between the transmitters and receivers, which results in a loss of emission output and degradation in the signal-to-noise ratio in receiving.

Document [6] also provides a description of the array antennas comprising loops formed by two strips arranged opposite one another on either side of the wall of a Teflon cylinder. The loops surround localized capacitors that enable the frequency tuning of the loop to be adjusted within an extremely small region, commonly call the "gap". This region of the antenna is also the place where each loop is connected with the outside via a "matching" circuit similar to those used for linear antennas.

The main advantage of loops consists in the greater uniformity of the field that is radiated by each element. On the other hand, their geometry tends to induce significant mutual coupling between the transmitters and the receivers, which often has to be reduced by introducing capacitive coupling, which is only completely effective for a given load or specimen.

Finally, the performances of the loops in this antenna type decrease rapidly as the operating frequency increases.

In general, in order to reduce the parasitic capacitance created by the specimen under analysis as far as possible, such a specimen being the patient's head for example, experience has shown that high capacitance "microstrip" type antennas are preferable to low capacitance antennas, because the parasitic capacitance in the latter will be too great.

The tuning and matching controls for this microstrip antenna type are difficult to achieve in particular because of the variation in impedance created by the proximity of a parasitic impedance such as the operator's hand when the operator tunes the antenna's frequency and matches its impedance.

Accordingly, the known array type antennas are not able to be matched precisely with the load (specimen) introduced into the antenna, resulting in non-homogeneous excitation of the protons on the specimen and consequently a poor quality image.

In this context, the objective of the present invention is to resolve the problems described in the preceding by suggesting a linear resonator of a high-frequency antenna with multiple paths for receiving and transmitting and capable of operating at a frequency above 128 MHz, while at the same time suggesting a means for resonance tuning and matching that enables the excitation of the protons to be standardized precisely for each load introduced into the antenna.

To this end, the invention suggests a linear resonator of a high-frequency antenna that is capable of emitting a radiofrequency excitation signal and of receiving a radiofrequency relaxation signal, said linear resonator comprising a radiating element that is capable of emitting a radiofrequency excitation signal and receiving a radiofrequency relaxation signal, which resonator is characterized in that it comprises:
- a balun circuit consisting of a power supply line and two coupling lines;
- a substrate consisting of a dielectric material supporting said radiating element and in which said balun circuit is embedded;
- two contact points connecting said balun circuit to said radiating element, said contact points being formed by one of the ends of said coupling lines extending out of said substrate, the distance separating the two contact points being selected such as to ensure the impedance matching of said resonator;
- a ground plane separating said coupling lines of said radiating element.

It will be recalled that a "balun" circuit is a circuit that assures matching between a symmetrical or balanced line, such as a two-wire, ungrounded line, and an asymmetrical line such as a coaxial cable of which one connector is properly connected to ground.

Thus with the linear resonators according to the invention it is possible to produce a high-frequency antenna in which the matching of each resonator is parameterisable at the design stage, such that it corresponds with the type of load that will be introduced into the antenna, that is to say the head or another body part.

Matching of the resonator is performed mainly by selecting the distance that separates the two contacts of the balun circuit with the radiating element when the resonator is being designed. The two contact points are formed by the two ends of the coupling lines that protrude from the substrate. Thus, the coupling lines and the contact points on the radiating element enable the generation of a magnetic field that is collinear with the upper ground plane of the resonator by magnetic coupling. Accordingly, overvoltages in the resonator are minimized, thus helping to minimise undesirable power dissipation.

Matching of the resonator is also dependent on the dimensions of the balun circuit that is embedded in the substrate, that is to say the dimensions of the power supply line and the coupling lines.

The term "embedded in the substrate" is understood to indicate that the balun circuit is buried inside the substrate in such manner that the substrate completely covers the balun circuit.

According to an advantageous embodiment of the invention, the resonators according to the invention also comprise adjustment means with which it is possible to more precisely adjust the matching that was defined when the resonator was designed and the resonance tuning of the antenna in order to match it with the inherent resistivity of each individual head. In this way, it is possible for example to adjust each resonator of the antenna such that the antenna possesses a homogeneous excitation frequency regardless of the type of load that is introduced into the antenna.

According to this advantageous embodiment, the means for adjusting the matching and resonance tuning are separate from the radiating element and located at an arbitrary distance, far enough away from the element to minimise interference due to radiation and matching fluctuations caused by the "hand effect" when the operator is performing matching and turning adjustment operations.

The separate positioning of the adjustment means is made possible by the fact that the balun circuit is embedded inside the substrate, and by the fact that the balun circuit supplies energy to the two contact points for the radiating element via the coupling lines that are separated from the radiating element by a ground plane that is wide enough to preclude any likelihood of interaction.

Moreover, the remote adjustment means make it easier for the operator to gain access to the adjustment means. Accordingly, adjustments may be made quickly and without restrictions while the analysis is being carried out.

With the resonators according to the invention, it is possible to create an antenna array that is able to produce images between 200 MHz and 600 MHz, to provide a usable diameter greater than 250 mm, and in which each linear resonator is adjusted independently for transmitting a radiofrequency excitation signal.

Thus, with the capability to adjust matching specifically for each head, it is possible to reduce the emission power of the resonators and the signal-to-noise ratio (S/N ratio) is increased during receiving.

The resonator according to the invention may also feature one or more of the characteristics listed in the following, alone or in accordance with all technically possible combinations thereof:
- said resonator comprises adjustment means for adjusting the matching and the resonance frequency for said resonator;
- said adjustment means are connected to said balun circuit and are arranged at a distance from said radiating element such that an adjustment operation carried out by an operator does not affect either the matching nor the resonance tuning of said radiating element;
- said adjustment means are formed by a π circuit such as a π circuit comprising two variable capacitors and one inductor;
- said resonator comprises a plurality of ground planes that cover each face of said substrate, this plurality of ground planes comprising at least a primary, upper ground plane that covers the upper part of said substrate;

said radiating element is brazed or welded onto two ceramic capacitors, which are brazed or welded onto said upper ground plane;

said ceramic capacitors are capacitors that feature a quality factor greater than 1000;

said ceramic capacitors are produced from alumina that has a purity equal to at least 96% by weight;

the values of said capacitors being selected such that they determine the resonance frequency of said resonator;

said radiating element is formed by a conducting element with a cross section in the shape of an open U;

said radiating element is formed by a conducting element with a rectangular cross section;

said radiating element is formed by a track printed on a layer of dielectric substrate affixed permanently to said upper ground plane;

said radiating element comprises twists at its ends;

the twists are shaped such that they determine the resonance frequency of said resonator.

A further object of the invention is a high-frequency antenna for a nuclear magnetic resonance apparatus comprising an insulating body and a plurality of linear resonators according to the invention, characterized in that said resonators are mounted detachably in housings of said insulating body of said antenna.

The antenna according to the invention may also feature one or more of the characteristics described in the following, individually or in any technically possible combination thereof:

said antenna comprises a detachable crown designed to hold said resonators in position in their respective housings;

the internal walls of said housings, with the exception of the one facing the radiating element, are metallised so as to insulate each resonator;

said housings are dimensioned so as to create a pocket of air around each radiating element of each resonator in position inside said insulating body;

said antenna comprises a shield on the outer wall of said insulating body.

Other characteristics and advantages of the invention will become more apparent upon reading the description thereof provided below, which is intended for purely illustrative purposes and is not intended to be limiting in any way, with reference to the accompanying drawing, in which.

Antenna 10 is a high-frequency, multipath antenna used in a Magnetic Resonance Imaging (MRI) apparatus, with a very strong magnetic field, that is to say greater than 7 Tesla. The antenna 10 shown has particularly been modified to examine a human head represented in FIG. 1 by an anatomical model 200.

Figure 1:
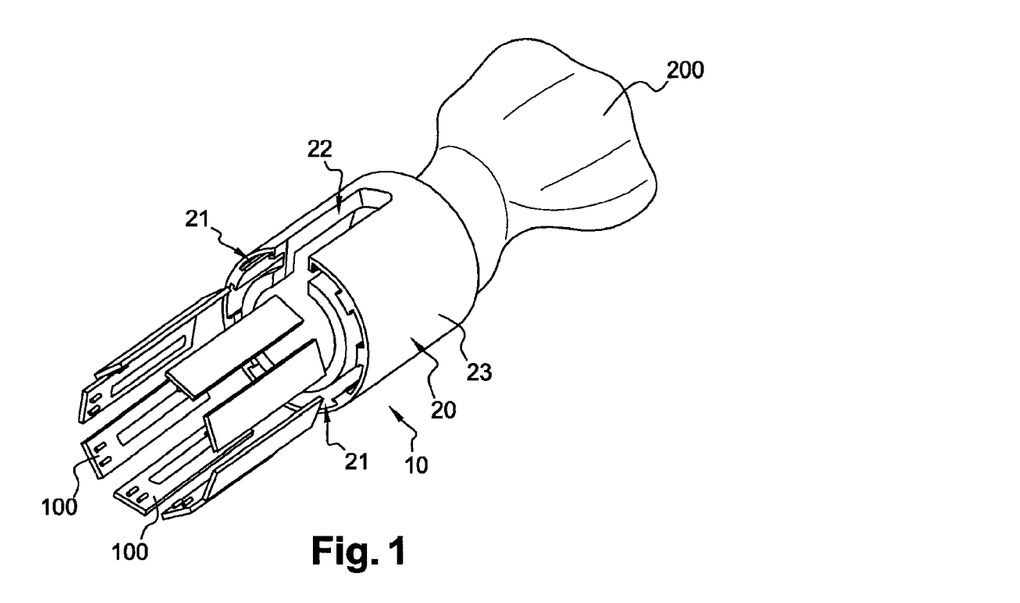
FIG. 1 shows a general overview of an anatomical model and a high-frequency MRI antenna comprising linear resonators according to the invention.

Antenna 10 comprises a cylindrical insulating body 20 that includes a plurality of housings 21 arranged circumferentially around the periphery of insulating body 20, into which linear resonators 100 are inserted from the rear, that is to say the side opposite the side from the patient is introduced.

In known manner, insulating body 20 of antenna 10 also comprises a light 22 that is disposed on outer side wall 23 of insulating body 20, enabling various mirror systems to be mounted for the purpose of providing visual stimulation for patients in functional MRI applications.

Insulating body 20 is constructed as a single part or by assembling machined parts made from a polymer material, such as polyoxymethylene for example, also called polyformaldehyde, and better known by the name "POM". The use of POM is particularly advantageous and suited to this application because it exhibits good electrical insulation and has a low dielectric constant ($\epsilon_r$=3.7).

According to an advantageous embodiment of the invention, the internal walls, with the exception of the one facing the radiating element, housings 21 created in the insulating body 20 for housing resonators 100 are metallised to provide maximum insulation between each resonator 100. Increasing the insulation between each resonator thus helps to reduce mutual coupling, that is to say the transfer of power between an energized resonator, or group of resonators combined and linked with the same power source, and an adjacent resonator or an adjacent group of resonators that are not energized in transmission mode; increased mutual coupling still induces a loss of output in array type antennas. By way of example, the internal walls of housings 21 may be metalized with a deposit of copper.

Outside lateral wall 23 of insulating body 20 may also be covered by a conductive shield that is split in the direction of the length of the antenna to avoid the formation of a current induced by the operation of the gradient magnets in the MRI apparatus.

Resonators 100 are modular inside housings 21 in insulating body 20. They are easily inserted along a sliding system inside housings 21. In order to ensure the mechanical stability of resonators 100 when they are in position inside insulating body 20, a perforated crown (not shown) may be secured to the insulating body by means of non-magnetic bolts.

Figure 2:
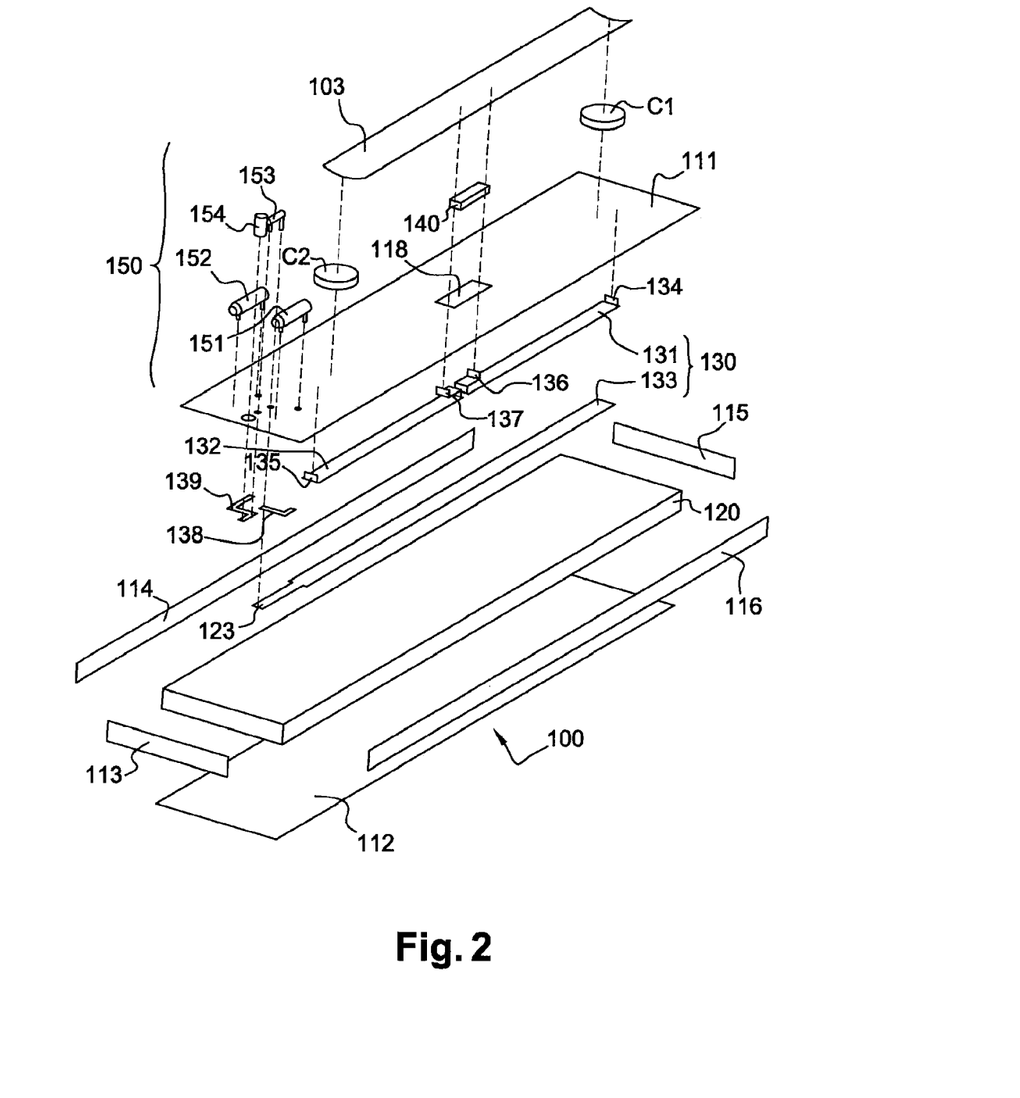
FIG. 2 shows an exploded view of a first embodiment of the linear resonator of FIG. 1.
Figure 3:
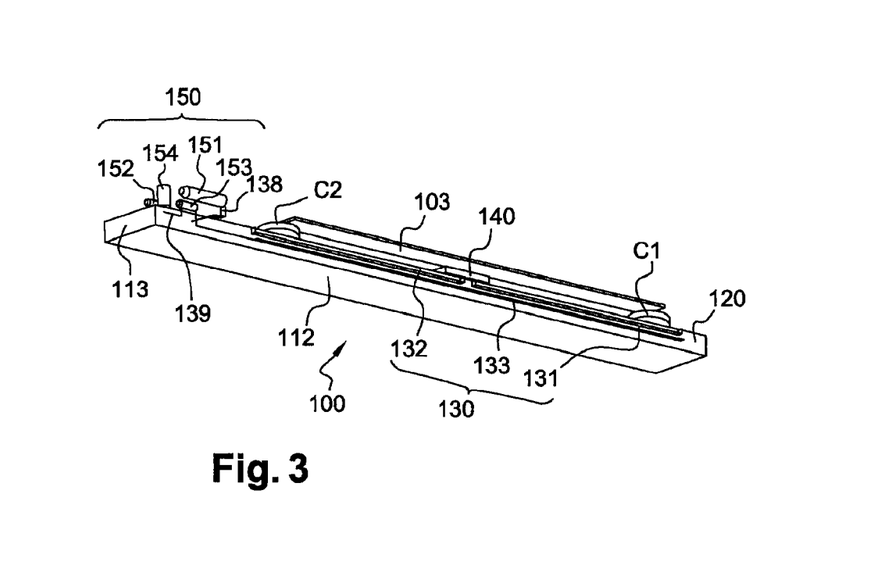
FIG. 3 shows an assembled view of the first embodiment of the linear resonator of FIGS. 1 and 2, including a partial longitudinal section.

FIGS. 2 and 3 provide a more detailed illustration of a first embodiment of the resonator 100 shown in FIG. 1.

In particular, FIG. 2 shows an exploded view of resonator 100 while FIG. 3 is gives a more detailed view of an assembled resonator with a partial longitudinal cross section.

Resonator 100 includes:
a radiating element 103;
two capacitive elements C1, C2;
a substrate 120;
a plurality of ground planes 111, 112, 113, 114, 115, 116;
a balun circuit 130.

In this first embodiment, radiating element 103 is constructed with a straight, essentially rectilinear element made from a conductive material, advantageously from copper, comprising section in the shape of a wide open U. At all events, radiating element 103 may be constructed with a rectilinear element having a rectangular cross section.

The wide open U shape of radiating element 103 enables its mechanical rigidity and performance to be improved. On the other hand, its rectangular shape means that the resonator according to the invention may be of simpler design.

Radiating element 103 is brazed or welded onto the upper face of the two disc-shaped capacitive elements C1, C2, which are made conductive by depositing a layer of copper on them, or by bonding a thin metallic disc (not shown) to the upper surface and possibly also the lower surface of capacitive discs C1, C2. Capacitive discs C1, C2 are advantageously rendered conductive by the deposition or adhesive application of copper.

Capacitive discs C1, C2 are made from an extremely pure dielectric material, that is to say consisting of at least 96% by weight of the material, in order to guarantee minimal losses. By way of example, the dielectric material of capacitive discs C1, C2 is a ceramic material such as alumina with a purity at least equal to 96% by weight.

The two capacitive discs C1, C2 form two capacitors, the values of which are determined according to the length of radiating element 103 and the operating frequency of the MRI apparatus for the purpose of obtaining a resonance.

The two capacitive discs C1, C2 are mounted in fixed manner on an upper ground plane 111 by brazing or also welding.

Resonator 100 comprises a plurality of ground planes created by combining the main, upper ground plane 111 that covers the upper surface of the substrate, and secondary ground planes 112, 113, 114, 115, 116 that cover the other surfaces of substrate 120. The ground planes thus form an electrical continuum. Substrate 120 is made from a dielectric material such as a composite material, for example glass-teflon. Ground planes 111, 112, 113, 114, 115, 116 may be produced by deposition of a metal on substrate 120 or also by affixing conductive strips, ideally made of copper, to substrate 120 by adhesion.

Resonator 100 comprises a balun circuit 130 that connects radiating element 103 and SMA type coaxial adapter 154, the coaxial adapter serving as the sole electrical interface between resonator 100 and the outside world.

Balun circuit 130 is an electrical circuit that is used widely with antennas to create a link between an ungrounded, symmetrical or balanced transmission line, that is to say radiating element 103, and an asymmetrical transmission line, that is to say coaxial adapter 154, the external connector of which is connected to upper ground plane 111.

Balun circuit 130 is created with a power supply line 133 and two mirrored coupling lines 131 and 132, which are embedded in substrate 120 as is shown in the longitudinal cross section through substrate 120 in FIG. 3, power supply line 133 and the mirrored coupling lines 131, 132 being separated by substrate 120 and not having any electrical contact. Power is transmitted between power supply line 133 which receives the modulated signal and the coupling lines by electromagnetic proximity coupling.

Balun circuit 130 is embedded in substrate 120 by depositing multiple substrate layers, typically three layers, which are merged into a single unit, one on top of the other. Each substrate layer is formed by a low loss material and contains a part of balun circuit 130, balun circuit 130 being constructed by superposing different substrate layers on which a part of the circuit is printed directly on the substrate or deposited.

Ends 134 and 135 of coupling lines 131, 132 are in contact with primary ground plane 111 whereas the two central contacts 136 and 137 protruding from substrate 120 form contact points between radiating element 103 and balun circuit 130. The contact points are advantageously positioned symmetrically relative to radiating element 103. To this end, a rectangular aperture 118 is provided in primary ground plane 111 to allow central contacts 136, 137 to pass through, protruding from the substrate. This aperture 118 is advantageously dimensioned so as to ensure insulation of at least 1 mm between central contacts 136, 137 and primary ground plane 111.

According to another embodiment, the contact points may also be positioned asymmetrically relative to the centre of radiating element 103.

A central connecting element 140 is attached in fixed manner to radiating element 103, central contacts 136, 137 and substrate 120, for example by adhesion. This central connecting element 140 merely provides mechanical reinforcement between radiating element 103 and substrate 120. It may be produced for example from the same material as that of capacitive discs C1, C2, that is to say alumina with a purity equal to at least 96% by weight. Central connecting element 140 is advantageously located in the space that separates the two central contacts 136, 137.

Matching of resonator 100 is assured mainly by the selection of the distance between central contacts 136 and 137 of the two mirrored coupling lines 131, 132 and radiating element 103, in other words by the length of central element 140. Thus, overvoltages are minimized, and undesirable power dissipation may be prevented. The choice of material for the substrate 120 used for the balun circuit also enables the matching to be varied. In addition, varying the dimensions of power supply line 133 and the two coupling lines 131, 132 also enables matching of resonator 100 to be varied.

Accordingly, the distance between central contacts 136, 137 will be defined according to the type of load that is introduced into the antenna, so that matching may be adapted according to the payload.

In an MRI application and for a load corresponding to a human head, the distance between central contacts 136, 137 is advantageously in the order of 3 to 4 cm.

Nevertheless, in order to address the variability in the shape and volume of human heads, the resonator 100 according to the invention includes a tuning and matching circuit, with which the antenna may be adjusted more accurately according to the load or specimen being analysed.

Control circuit 150 is made up of a π circuit consisting of:
two variable capacitors 151, 152,
one inductor 153,
connection tracks 138, 139, submerged in substrate 120.

Control circuit 150 is located between balun circuit 130 and SMA type coaxial adapter 154, which is the only electrical interface resonator 100 has with the outside world.

The two ports of control circuit 150 are connected to the narrow end 123 of power supply line 133 and SMA type coaxial adapter 154 respectively.

Connection track 138 connects inductor 153 to variable capacitor 151 and connection track 139 connects inductor 153, a coaxial adapter 154, and the second variable capacitor 152.

Because of the special structure of resonator 100 and balun circuit 130, which is embedded in substrate 120, π circuit 150 is advantageously remote from radiating element 103 and positioned at an arbitrary distance therefrom, sufficiently far away to minimise radiated interference and matching variations caused by "the hand effect" when the operator adjusts the impedance adaptation. Typically π circuit 150 is located at the rear end of resonator 100, that is to say at the end opposite the end which is inserted in housings 21 of insulating body 20.

This location at a distance from radiating element 103 also makes it much more convenient for the operator to access the adjustment elements for resonator 100. Indeed, once the resonators 100 are in place inside insulating body 20, these adjustment elements are still readily accessible, so that the resonators may be adjusted quickly and easily.

Tuning and matching adjustments may be made easily by changing the position of the central axis of variable capacitors 151, 152. The central axis is formed by the capacitor's second electrode and it is connected to the common earth, particularly by upper ground plane 111 of resonator 100. By way of example, adjustment by rotating the central axis may be carried out with a ceramic screwdriver, in order to further reduce the "hand effects".

Once resonators 100 have been placed inside insulating body 20, the common ground for all resonators 100 is connected for all of them in order to prevent parasitic cavity or volume modes that would couple the resonators.

Connection tracks 138, 139, power supply line 133 and coupling lines 131, 132 are advantageously made from copper.

In this first embodiment of the invention, radiating element 103 and upper ground plane 111 are separated by a dielectric material in the form of air which thus helps to minimize losses and increase the radiated output of resonators 100. At all events, this layer of air, whose thickness is determined by the thickness of capacitive discs C1, C2, is advantageously in the order of a few millimetres, might render the resonance frequency of the resonator sensitive to a variation in the dielectric constant of the air, which fluctuates according to atmospheric humidity. In order to evaluate this sensitivity, one may first consider that the angular resonance frequency $\omega_0$ of resonator 100 is given by the equation:

$$\omega_0 = \frac{1}{(C_T \cdot L)^{1/2}};$$

where $C_T$ is the total capacitance corresponding to the sum of the capacitances formed between radiating element 103 and ground plane 111, ie C3, and the two capacitances C1, C2 formed by the capacitive discs;

L represents the inductance of resonator 100

By applying differential calculus, it is demonstrated that:

$$(d\omega_0/\omega_0) = -0,5(dC_T/C_T) = -0,5(C_3/C_T) \cdot (d\epsilon_{ra}/\epsilon_{ra})$$

where $\epsilon_{ra}$ is the permittivity relative to air.

The value $d\epsilon_{ra}$ for air saturated with water vapour, that is to say the worst conceivable case, at 30° C. is $4.10^{-4}$. Thus, by way of example, for a capacitance C3 of 17 pF and a total capacitance $C_T$ in the order of 49 pF, frequency drift due to atmospheric humidity only varies by about 20 kHz, which is extremely low in comparison to a resonance above 200 MHz and a passband in the order of 1 MHz at −10 dB.

Finally, it is important to maintain a pocket of air between radiating element 103 and the internal walls of housings 21 for each resonator 100 that is placed in the body of antenna 10. The thickness of this air pocket is defined by the closeness of the walls of housings 21 and may thus be used to modulate the mutual coupling between resonators 100.

It should be noted that the interior walls of housings 21 are not metallised, so the interior walls must be at a distance equivalent to at least 2 millimetres from radiating element 103. In the present case, in which the interior walls of housings 21 are metalized, the interior walls must be located farther away than in the case where the interior walls are not metalized, that is to say typically at a distance of about 6 millimetres.

An embodiment of the resonator according to the first embodiment shown in FIGS. 2 and 3, will be described for an eight-path, 7 Tesla MRI antenna, resonator 100 thus operating at a frequency close to 298 MHz, depending on the effective, measured value of $B_0$.

In this exemplary embodiment, insulating body 20 for the antenna is cylindrical with an internal diameter of 250 mm and an external diameter of 317 mm. Insulating body 20 is furnished with as many housings 21 as there are resonators 100, that is to say eight.

Each of the eight resonators includes:
- a radiating element 103 formed by a 1 mm thick copper sheet, bent into the shape of a wide U, having a length of 260 mm, a width of 24 mm and a height of 3 mm, with a capacitance in the order of 17 pF;
- two capacitive discs C1, C2 made from alumina with a purity at least equal to 96% by weight, and having a diameter of 24 mm, a thickness of 3.18 mm, and a capacitance in the order of 16 pF;
- a glass-teflon substrate 120 having a length of 370 mm, a width of 70 mm and a height of 9.54 mm;
- a plurality of ground planes 111, 112, 113, 114, 115, 116 created by copper strips with a thickness of 18 μm covering each face of the glass-teflon substrate;
- a power supply line 133 formed by a copper strip with a thickness of 18 μm and embedded in the substrate, having a length of 318 mm and a width of 10 mm;
- two coupling lines 131, 132 in the form of copper strips having a thickness of 18 μm, embedded in substrate 120, having a length of 140 mm, a width of 10 mm and a height of 6.36 mm;
- a central connection element 140, attached in fixed manner to radiating element 103 and to central contacts 136, 137 of coupling lines 131, 132, in the form of rectangular tablet of alumina of a purity at least equal to 96% by weight and having a length of 40 mm, a width of 7 mm and a height of 3.18 mm.
- connection tracks 138, 139 made from copper with a thickness of 18 μm;
- two capacitors 151, 152 with capacitance variable between 1 and 10 pF;
- an air core inductor 153 with inductance of 22 nH;
- a non-magnetic SMA type coaxial connector 154.

The design and optimization of antenna 10 are carried out on the basis of a digital simulation using an HFSS code (finite element method), which is produced by the company Ansoft and known in the field of nuclear magnetic resonance imagery. During the simulation, the patient's head is represented by a digital model, called an anatomical phantom, supplied by Aarkid, North Berwick, Scotland for HFSS simulations. Anatomical model 200 is composed of eight types of organic tissue corresponding to the various anatomical elements of the head: muscles, cranium, jaw, lateral lobes, cerebellum, tongue, spinal cord, eyes.

Figure 4:
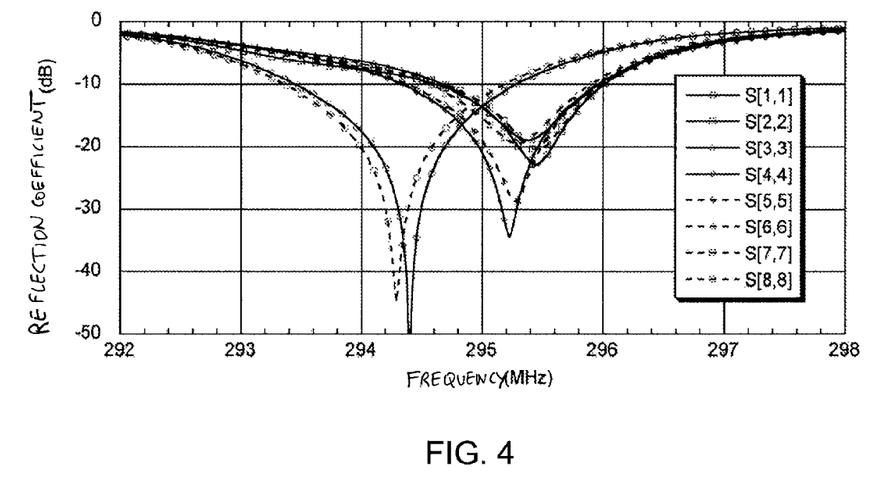
FIG. 4 is a graph representing the resonance frequency of each linear resonator of the antenna of FIGS. 1 and 3 before the resonators are parameterized by means of a tuning circuit and the matching circuit.

FIG. 4 shows the results of the simulation in the form of a graph showing the resonance frequency of each linear resonator 100 of the antenna 10 illustrated in FIG. 1 before the "tuning" and "matching" circuits are parameterised.

According to this simulation, it will be observed that without tuning and matching adjustment with the aid of π adjustment circuit 150, each of the linear resonators 100 resonates at a different frequency, slightly offset from the working frequency, despite the fact that the resonators are of identical construction. This offset is caused by the act of introducing a load into the antenna. When resonators 100 of antenna 10 are numbered from R1 to R8 starting from the resonator at the top and to the left of light 22 in insulating body 20 of antenna 10, a clear symmetry is still evident between resonators R1 and R8, R2 and R7, and so on. This symmetry in the signals reflects the mirror symmetry of the phantom relative to the sagittal plane.

Figure 5:
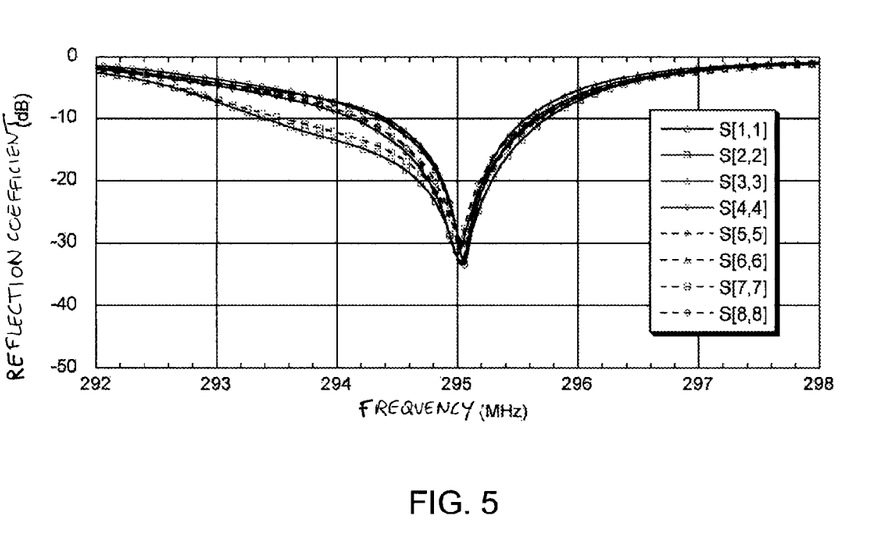
FIG. 5 is a graph representing the resonance frequency of each linear resonator of the antenna after the resonators are parameterized by means of the tuning circuit and the matching circuit.

The π circuit 150 in resonators 100 according to the invention enables the various resonators 100 to be adjusted perfectly so that they all operate on the same resonance frequency and with very good impedance matching. To this end, FIG. 5 shows the resonance frequency of each resonator 100 in antenna 10 after the resonance frequency tuning and impedance matching with the aid of π circuit 150. It will be recalled that π circuit 150 of resonator 100 is readily accessible, so the operator is able to tune the resonance frequencies and match the impedances of resonators 100 quickly and easily according to the load that is introduced into the antenna.

In order to be able to predict the performance of an antenna array, it is necessary to create a distribution map of the magnetic excitation component in a coordinate system rotating at the Larmor frequency of the radiated radiofrequency field by each resonator when the load is positioned inside the antenna. This map of $B_1^+$ may be created by simulation on the basis of the magnetic component $B_1$ of the excitation radiofrequency field or directly by taking measurements from a prototype in an MRI scanner.

The simulation is carried out using the HFSS digital simulation software manufactured by Ansoft. The principle of the simulation consists in systematically studying the distribution of magnetic component $B_1$ such as:

$$B_1 = \begin{vmatrix} B_{1x} \\ B_{1y} \end{vmatrix}$$

wherein indices "x" and "y" refer to a fixed Cartesian coordinate system, associated with the laboratory, according to axes X and Y (not shown), perpendicular to axis Z, which is the longitudinal axis of the antenna (not shown), longitudinal axis Z being the direction of the global magnetization of field $B_0$.

The simulation of magnetic field $B_1$ enables deduction of $B_1^+$ by intermediate calculation, wherein $B_1^+$ is corresponding to the phasor of magnetic field $B_1$, broken down in a coordinate system that rotates in the same direction as the spins according to the equation:

$$B_1^+ = \vec{B}_1 \cdot \vec{e}_{LHCP}$$

where $$\vec{e}_{LHCP} = \frac{1}{\sqrt{2}} \begin{vmatrix} 1 \\ j \end{vmatrix}$$

The mapping operation representing the distribution of magnetic field $B_1^+$ may also be carried out experimentally by measurement of a prototype. For this, all this is needed is to determine the mapping of magnetic component $B_1^+$ directly, particularly using an acquisition method called Actual Flip-angle Imaging (AFI) [Vasily L. Yarnykh, Actual Flip-angle Imaging in the Pulsed Steady State. Magn Reson Led 2007; 57:192-200], which is known from the field of medical imaging.

Figure 6:
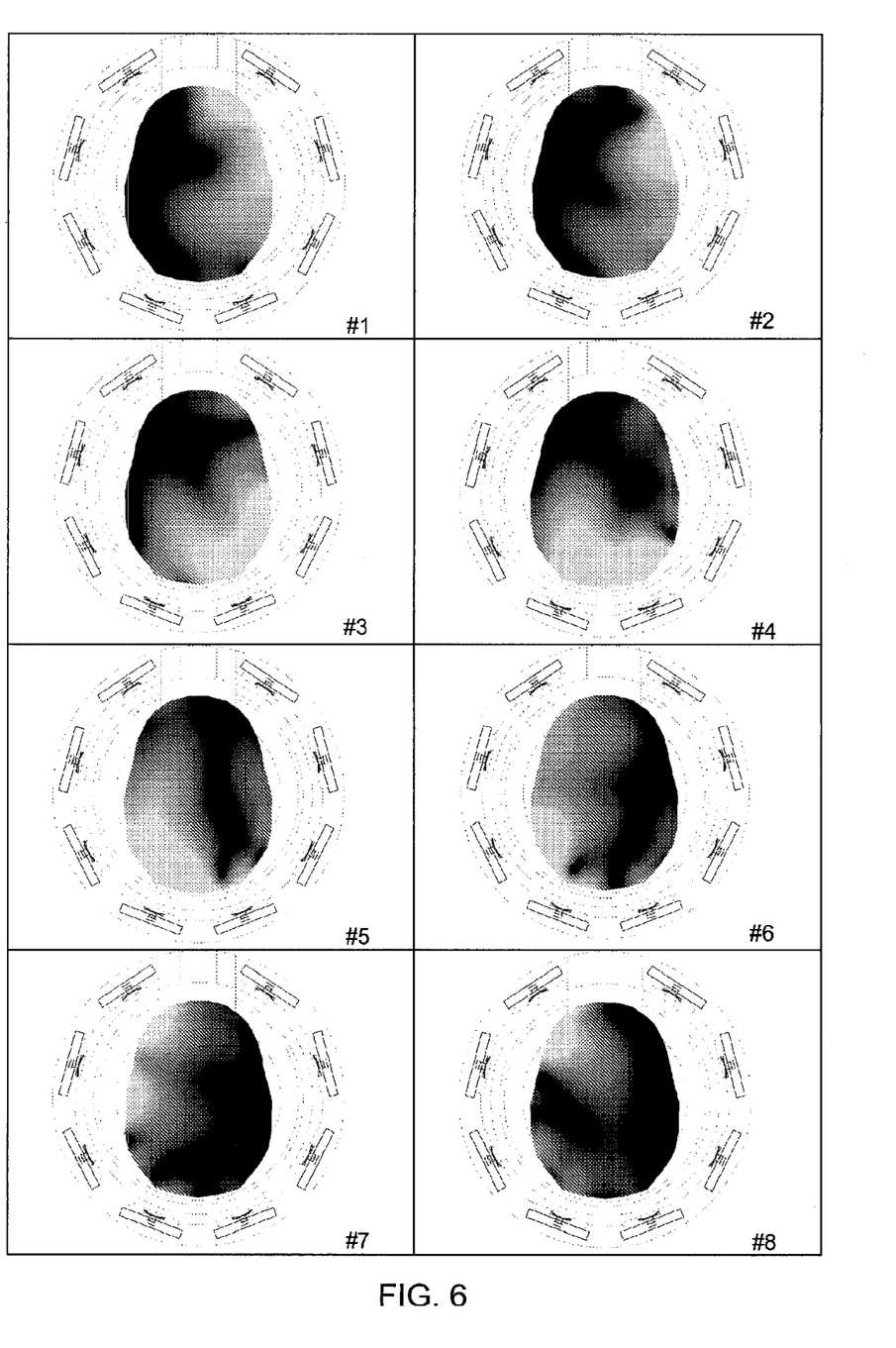
FIG. 6 shows an axial section of the high-frequency MRI antenna including the anatomical model to show an example of the division of radiating field $B_1^+$ for each linear resonator.

FIG. 6 shows the map of radiated field $B_1^+$ for each resonator R1 to R8 visible by a introduced load (the anatomical phantom in our case) for a 7 Tesla, eight-path antenna comprising the resonators 100 defined in the preceding.

The distribution scale corresponds to a variation of 0 to 4 µT, obtained for an incident power of 100 W.

With the resonators according to the invention, the antenna is able to reduce the intensity artefacts in the 3D image, particularly in the area of the lateral lobes and the cerebellum. The artefacts are reduced to 7% with the exemplary embodiment described in the preceding.

In order to obtain an optimum result, antenna 10 and resonators 100 are controlled by the parallel transmission method using recombination of two images acquired consecutively to two complementary excitation pulses. This known method particularly enables the excitation to be homogenized in a selected region of interest, also called ROI. The powers and phases applied to each resonator for a flip angle equivalent to 20 degrees and a pulse duration of a millisecond are shown in the following table for exemplary purposes:

| | First pulse | | Second pulse | |
|---|---|---|---|---|
| Path | Power (Watt) | Phase (degrees) | Power (Watt) | Phase (degrees) |
| R1 | 6.84 | −1.1 | 2.48 | −164.7 |
| R2 | 15.1 | 13.4 | 1.43 | −151.3 |
| R3 | 13.1 | 29.3 | 1.12 | 70.3 |
| R4 | 9.56 | 25.2 | 2.85 | 71.8 |
| R5 | 7.30 | 45.6 | 1.28 | 45.4 |
| R6 | 8.53 | 42.8 | 3.01 | −4.3 |
| R7 | 8.36 | 49.4 | 9.20 | −88.9 |
| R8 | 3.40 | 81.3 | 19.8 | −92.0 |

Figure 7:
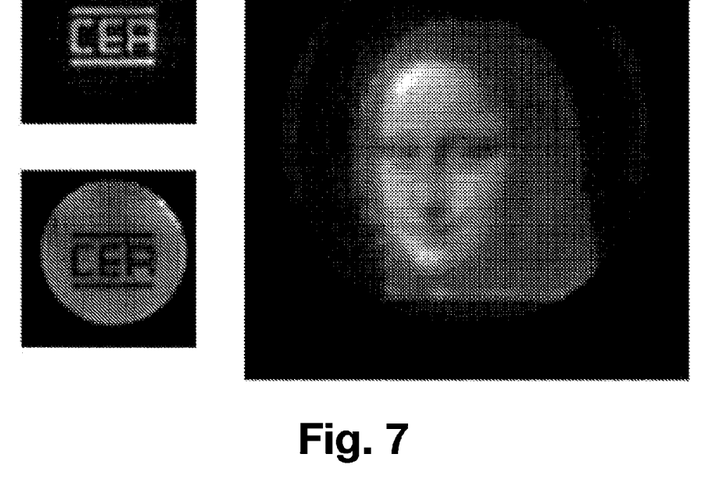
FIG. 7 shows an example of imaging obtained using a high-frequency antenna comprising linear resonators according to the invention.
Figure 8:
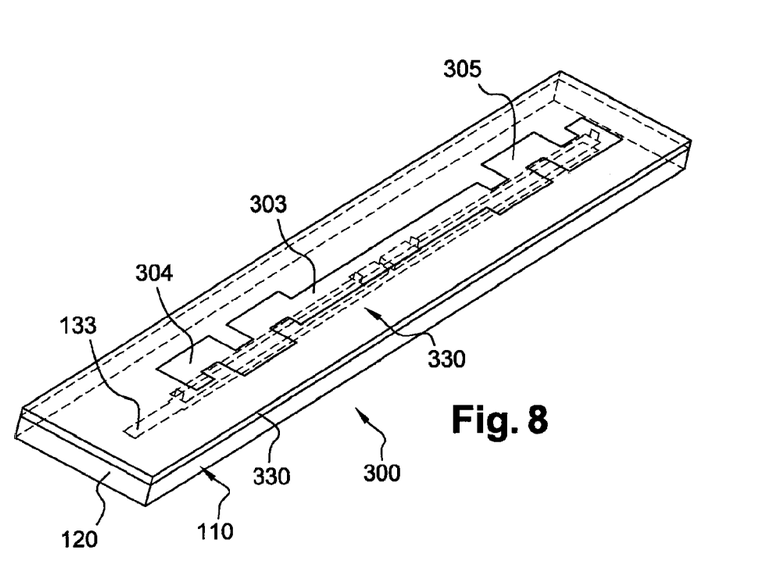
FIG. 8 shows a second embodiment of a linear resonator according to the invention.

FIG. 7 shows examples of images obtained using an antenna such as is described in the embodiment using a transmission method called selective imaging, described by J. Pauly et al (Journal of Magnetic Resonance 81:43-46, 1989). This method consists in inserting a predefined object inside a homogeneous phantom, in this case a glass ball filled with saline solution. FIG. 8 is a variant of the previous FIGS. 2, 3, the elements that are common to devices 100 and 300 are identified with the same reference number and perform the same functions. Accordingly, only the characteristics in which these two embodiments differ will be described here.

Resonator 300 according to this second embodiment differs from resonator 100 of FIGS. 1, 2, and 3 in that it comprises a radiating element 303 that is flat and integrated in a substrate panel 330 attached in fixed manner to substrate 120.

In this second embodiment, the dielectric formed by the air in resonator 100 is typically replaced by panel 330, which mist made of dielectric material.

In this second embodiment, the ceramic capacitive discs and the radiating element in a very flared U shape are not used, being replaced by substrate panel 330, which is typically made from the same material as that used for the substrate for balun circuit 130. The upper face of panel 330 is furnished with a wide metallised track 303, engraved directly onto panel 330 and serving as the radiating element.

The ends of radiating element 303 are of a specific shape, being formed by twists 304, 305 that enable radiating element 303 to resonate without the presence of ceramic capacitors.

It should be noted that the shape of twists 304, 305 has been deliberately worked out according to the desired resonance frequency of resonator 303.

Panel 330 includes a central aperture (not visible in FIG. 8) through which the central contacts of balun circuit 130 are able to pass and come into contact with radiating element 303.

This panel 330 is of smaller dimensions than substrate 120, so that panel 330 does not entirely cover upper ground plane 111 at the site of the variable capacitors and the inductor of the u control circuit (not shown).

With this second embodiment, it is possible implement a more rigid and more compact construction of resonator 300 than with the first embodiment. However, the performances achieved by the first embodiment shown in FIGS. 2 and 3 are superior to those obtained with this second embodiment.

Accordingly, because of this invention it is possible for the structure of the radiating element supported by two integrated, capacitors with very low loss and capable of operating at high power peaks to be variable in length according to needs within a frequency range from 200 MHz to 600 MHz. The arrangement of the resonators inside the insulating body of the antenna is selected so as to facilitate standardization of the excitation by parallel transmission methods and particularly to minimise the local accumulation of power in the tissues. It also enables shielding to be integrated for the purpose of reducing mutual coupling among the resonators.

In addition, a finite number of linear resonators may be combined to create a mini-antenna of a kind that operates in volume mode and integrated in an array of independent antennas of the same type. This configuration is made possible by the structure of the module resonators and provides a possibility to economise on the number of electronic control channels and the number of amplifiers needed to power the antenna while at the same time providing exceptional flexibility in terms of the parallel transmission. Finally, the resonators may be dimensioned with different lengths, combined with each other according to their lengths, and arranged in specific positions in the longitudinal direction, that is to say along the axis of the patient, and in the radial direction.

The invention has been described particularly with a view to its use in nuclear magnetic resonance imaging; however, it is equally applicable for the field of magnetic resonance spectroscopy (MRS).

The invention claimed is:

1. A linear resonator of a high-frequency antenna capable of emitting a radiofrequency excitation signal and receiving a radiofrequency relaxation signal, said linear resonator comprising:
    a radiating element configured to emit a radiofrequency excitation signal and receive a radiofrequency relaxation signal,
    a balun circuit comprising a power supply line and two coupling lines;
    a substrate made of a dielectric material supporting said radiating element and in which said balun circuit is embedded;
    two contact points connecting said balun circuit to said radiating element, said contact points being formed by one of the ends of said coupling lines extending out of said substrate, a distance separating the two contact points being selected so as to ensure an impedance matching of said resonator;
    a ground plane separating said coupling lines of said radiating element.

2. The linear resonator according to claim 1, comprising an adjuster configured to adjust a resonance matching and a resonance frequency of the resonator.

3. The linear resonator according to claim 2, wherein said adjuster is connected to said balun circuit and is arranged at a distance from said radiating element such that an adjustment operation by an operator will not affect a matching or a tuning of said radiating element.

4. The linear resonator according to claim 2, wherein said adjuster is formed by a π circuit that includes two variable capacitors and an inductor.

5. The linear resonator according to claim 1, comprising a plurality of ground planes that cover each face of said substrate, said plurality of ground plane comprising a primary, upper ground plane that covers the upper part of said substrate.

6. The linear resonator according to claim 5, wherein said radiating element is brazed or welded onto two ceramic capacitors, which are brazed or welded onto said upper ground plane.

7. The linear resonator according to claim 6, wherein said ceramic capacitors are capacitors that feature a quality factor greater than 1000.

8. The linear resonator according to claim 6, wherein said ceramic capacitors are made from alumina having a purity equal to at least 96% by weight.

9. The linear resonator according to claim 6, wherein the values of said capacitors are selected such that they determine the resonance frequency of said resonator.

10. The linear resonator according to claim 6, wherein said radiating element is formed by a conducting element with a cross section in the shape of an open U.

11. The linear resonator according to claim 6, wherein said radiating element is formed by a conducting element with a rectangular cross section.

12. The linear resonator according to claim 5, wherein said radiating element is formed by a track printed on a layer of dielectric substrate affixed permanently to said upper ground plane.

13. The linear resonator according to claim 12, wherein said radiating element comprises twists at the ends thereof.

14. The linear resonator according to claim 13, wherein the twists are shaped such that they determine the resonance frequency of said resonator.

15. A high-frequency antenna for a nuclear magnetic resonance apparatus comprising an insulating body and a plurality of linear resonators according to claim 1, wherein said resonators are mounted detachably in housings of said insulating body of said antenna.

16. The antenna according to claim 15, comprising a detachable crown configured to hold said resonators in position in their respective housings.

17. The antenna according to claim 15, wherein said internal walls of said housings, with the exception of the one facing the radiating element, are metallised so as to insulate each resonator.

18. The antenna according to claim 15, wherein said housings are dimensioned so as to create a pocket of air around each radiating element of each resonator in position inside said insulating body.

19. The antenna according to claim 15, comprising a shield on a outer wall of said insulating body.

20. A linear resonator of a high-frequency antenna, said linear resonator comprising:

a radiating element configured to emit a radiofrequency excitation signal and receive a radiofrequency relaxation signal, a balun circuit comprising a power supply line and two coupling lines;

a substrate made of a dielectric material supporting said radiating element and in which said balun circuit is arranged;

two contact points connecting said balun circuit to said radiating element, said two contact points being formed by an end of said coupling lines extending out of said substrate, a distance separating the two contact points being selected so as to permit an impedance matching of said resonator; and a ground plane separating said coupling lines of said radiating element.

* * * * *

UNITED STATES PATENT AND TRADEMARK OFFICE
CERTIFICATE OF CORRECTION

PATENT NO. : 9,520,636 B2  Page 1 of 1
APPLICATION NO. : 13/577557
DATED : December 13, 2016
INVENTOR(S) : Guillaume Ferrand et al.

It is certified that error appears in the above-identified patent and that said Letters Patent is hereby corrected as shown below:

On the Title Page

Item (56) References Cited: OTHER PUBLICATIONS

Please correct the 5th listed non-patent document to read:
YARNYKH V L

Item (57) Abstract:

Line 4 should read:
"…includes a radiating element to emit a radiofrequency…"

Signed and Sealed this
Twenty-eighth Day of February, 2017

Michelle K. Lee
*Director of the United States Patent and Trademark Office*